United States Patent [19]

Leicht et al.

[11] Patent Number: 4,876,656
[45] Date of Patent: Oct. 24, 1989

[54] CIRCUIT LOCATION SENSOR FOR COMPONENT PLACEMENT APPARATUS

[75] Inventors: John L. Leicht, Hawthorn Woods; Jeffrey D. Leitheiser, Crystal Lake, both of Ill.

[73] Assignee: Motorola Inc., Schaumburg, Ill.

[21] Appl. No.: 90,997

[22] Filed: Aug. 28, 1987

[51] Int. Cl.4 .............................................. G01B 11/03
[52] U.S. Cl. ..................................... 364/491; 364/559
[58] Field of Search ............... 364/491, 490, 489, 488, 364/559

[56] References Cited

U.S. PATENT DOCUMENTS

| | | | |
|---|---|---|---|
| 3,670,153 | 6/1972 | Rempert et al. | 364/491 |
| 3,908,118 | 9/1975 | Micka | 364/490 |
| 3,909,602 | 9/1975 | Micka | 364/490 |
| 4,163,212 | 7/1979 | Buerger et al. | 364/490 |
| 4,190,890 | 2/1980 | Marx | 364/491 |
| 4,297,676 | 10/1981 | Moriya et al. | 364/490 |
| 4,342,090 | 7/1982 | Caccoma et al. | 364/491 |
| 4,559,603 | 12/1985 | Yoshikawa | 364/491 |
| 4,611,292 | 9/1986 | Ninomiya et al. | 364/559 |
| 4,613,942 | 9/1986 | Chen | 364/513 |
| 4,628,464 | 12/1986 | McConnell | 364/491 |
| 4,636,948 | 1/1987 | Gotou et al. | 364/491 |
| 4,639,604 | 1/1987 | Murakami et al. | 364/490 |
| 4,672,557 | 6/1987 | Tamura et al. | 364/490 |
| 4,723,221 | 2/1988 | Matsuura et al. | 364/490 |
| 4,753,569 | 6/1988 | Pryor | 364/559 |

OTHER PUBLICATIONS

"High Resolution Optical Reflective Sensor", Hewlett Packard, Technical Data Jan. 1986, pp. 2-52-2-57.

*Primary Examiner*—Bruce Y. Arnold
*Assistant Examiner*—Terry S. Callaghan
*Attorney, Agent, or Firm*—Rolland R. Hackbart

[57] ABSTRACT

Unique circuit location sensing apparatus for component placement robots (100) utilizes a high-resolution optical reflective sensor (110) for detecting the location of selected circuit runners (300, 301) on a printed circuit board (350). The sensor (110) is mounted to the robot arm (106) and coupled by A/D converting circuitry (104) to the robot computer (102). The robot computer (102) positions sensor (110) over a selected runner (300, 301) and steps sensor (110) across the selected runner (300, 301), storing the digitized sensor output for each step. The robot computer (102) processes the digitized sensor outputs to determine the actual location of the selected runner (300, 301) and then calculates location offsets for the component placement program to be subsequently run on the robot computer (102). As a result, variations in actual location of circuitry on different printed circuit boards (350) are automatically compensated for and components are more accurately placed thereon. The unique circuit location sensing apparatus of the present invention may be advantageously utilized in any component placement robot for accurately detecting the location of circuitry prior to placement of components on the printed circuit board.

10 Claims, 5 Drawing Sheets

CIRCUIT LOCATION SENSOR FOR COMPONENT PLACEMENT APPARATUS

BACKGROUND OF THE INVENTION

The present invention is generally related to component placement apparatus and more particularly to an improved circuit location sensor for use in robotic component placement apparatus.

In the prior art, location sensors for robots typically include a camera and a digital image processor in order to determine the position of circuitry on a printed circuit board. The camera scans the printed circuit board, while the digital image processor receives and processes each pixel in successive video frames to determine location-offset information. Use of camera location sensors incurs a substantial cost penalty in terms of equipment and software.

Alternatively, location-offset information may be manually entered into component placement programs to compensate for dimensional tolerances in printed circuit boards. This alternative is both time consuming and costly since manual labor is required. Accordingly, there is a need for a circuit location sensing apparatus and process that automatically determines location-offset information for printed circuit boards and compensates therefor.

SUMMARY OF THE INVENTION

Accordingly, it is an object of the present invention to provide improved and inexpensive circuit location sensing apparatus for use in component placement apparatus.

It is another object of the present invention to provide improved circuit location sensing apparatus for use in component placement apparatus that automatically determines location-offset information for printed circuit boards and compensates therefor.

Briefly described, the present invention encompasses sensing apparatus for component placement apparatus including a robot arm for placing components on a circuit board having circuit elements thereon. The component placement apparatus is responsive to a control signal for positioning the robot arm and producing a strobe signal when the robot arm is positioned. The improved sensing apparatus comprises: sensing circuitry attached to the robot arm and including a light source for illuminating the circuit board and a light sensor for producing an output signal having a magnitude proportional to the reflected light from the illuminated circuit board; a converter coupled to the sensor for converting the sensor output signal to a digitized signal in response to the strobe signal; a processor for producing the control signal to step said sensing means across a pre-selected circuit element and processing the digitized signal produced at each step for detecting the location of a pre-selected circuit element on the circuit board.

DESCRIPTION OF THE PREFERRED EMBODIMENT

Figure 1:
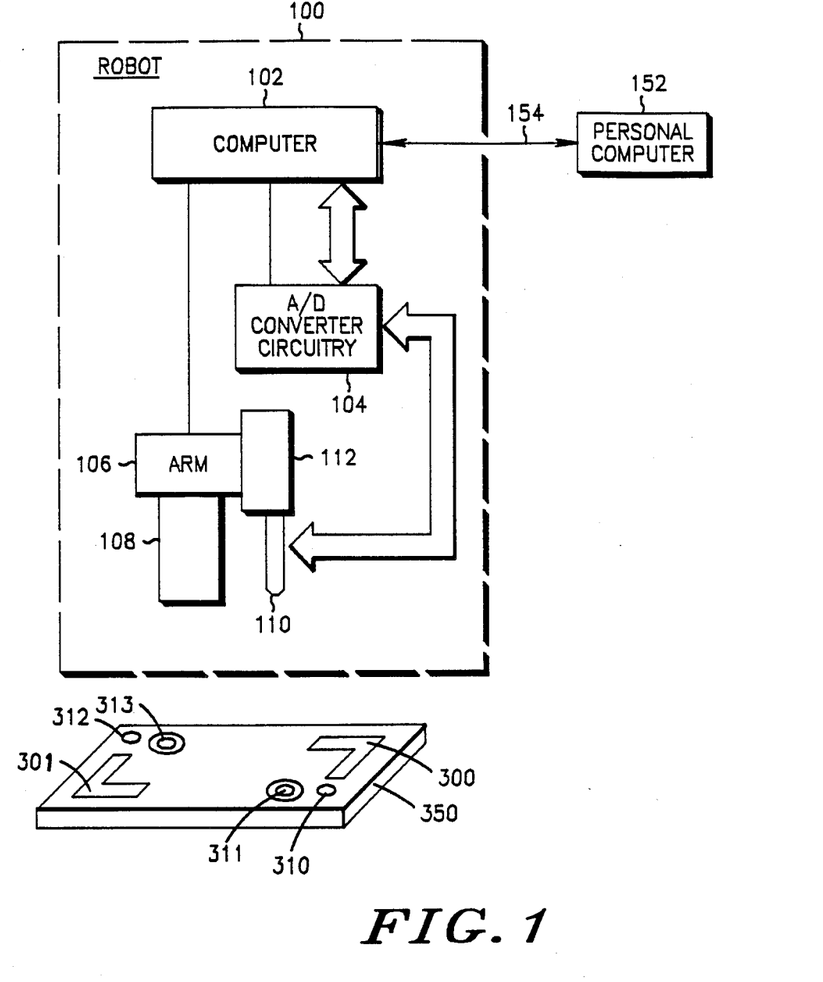
FIG. 1 is a block diagram of a component placement robot 100 and a personal computer 152 that may advantageously utilize the present invention.

In FIG. 1, there is illustrated a component placement robot 100 and a personal computer 152 that may advantageously utilize the present invention. Personal computer 152 may be any commercially available computer that has a data link 154 for running a component placement program on computer 102 of robot 100. In the preferred embodiment of the present invention, personal computer 152 is an IBM personal computer. Robot 100 may be any commercially available component placement robot that, under program control, automatically picks and places surface-mount components on a printed circuit board 350. Robot 100 includes arm 116 with end effector 108 for accessing and placing surface-mount components. In the preferred embodiment of the present invention, robot 100 is an Accusembler Model SSR-H414-HS.

Accoring to the present invention, bracket 112 and sensor 110 are coupled to robot arm 116 for sensing the precise location of metalized circuit runners 300-301 or metalized circuit pads 310-313 on printed circuit board 350. Bracket 112 may include an air cylinder for extending sensor 110 toward printed circuit board 350 when taking measurements. Sensor 110 is coupled to A/D converting circuitry 104 which converts the sensor output to an 8-bit digitized signal. Sensor 110 preferably includes a commercially available bar-code sensor which includes a light source, a light sensor and a transistor for producing an output whose magnitude is proportional to the amount of light reflected from printed circuit board 350. In the preferred embodiment of the present invention, sensor 110 is a Hewlett Packard HBCS-1100 high-resolution optical reflective sensor.

Figure 3:
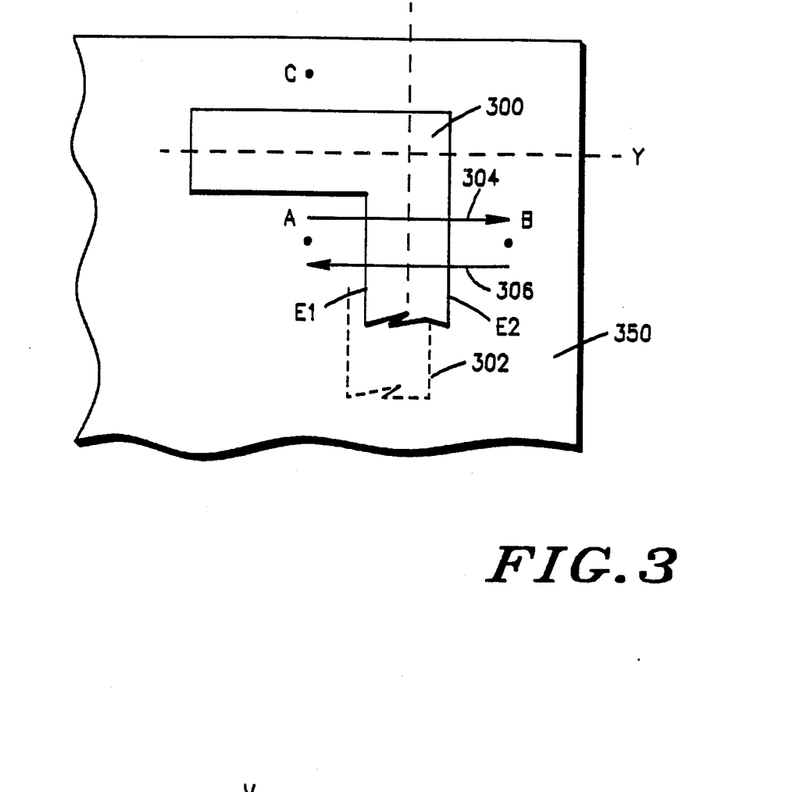
FIG. 3 is a section of printed circuit board 350 including metalized circuit runner 300 on the surface of the printed circuit board.

Referring to FIG. 3, sensor 110 may be positioned over circuit elements, such as runner 300 or pad 310, and stepped across it to determine the precise location of that circuit element. Robot computer 102 produces a control signal for positioning and stepping robot arm 116 across circuit runner 300. As sensor 110 is stepped across circuit runner 300, the amount of reflected light detected by sensor 110 increases due to the greater reflectivity of the circuit artwork pattern. The output signal of sensor 110 has a magnitude proportional to the amount of reflected light. The output signal of sensor 110 is converted to a digitized signal by A/D converter circuitry 104 in response to a strobe signal from robot computer 102, inputted into robot computer 102, and processed by robot computer 102 into location-offset information for correcting dimensional locations. Robot computer 102 uses the digitized signal to calculate location offsets for the component placement program to be run also by robot computer 102. The calculated location offsets compensate for variations introduced in the manufacture of printed circuit boards 350. By utilizing the present invention, variations in each printed circuit board 350 may be compensated for automatically prior to placement of surface-mount components thereon. The circuit location sensor and process of the present invention may be advantageously utilized in any component placement robot simply by coupling unique sensor 110 to the robot arm and A/D converting circuitry to the robot computer.

A section of printed circuit board 350 including circuit runner 300 has been expanded in FIG. 3 to illustrate the circuit location sensing process of the present invention. Circuit runner 300 may vary in position on different printed circuit boards 350. For example, on another printed circuit board 350, circuit runner 300 may be in positioned as shown by dashed lines 302. Sensor 110 is positioned by robot 100 initially at point A and stepped along Y-axis to point B along path 304, and then back to point A along path 306. For maximum reflectance, sensor 110 is positioned between 4.07 and 4.27 millimeters from printed circuit board 350. Sensor 110 is stepped in increments of 0.03 millimeters. At each step, the output of sensor 110 is digitized by A/D converter circuitry 104 in response to a strobe signal from robot computer 102 and stored in the memory of robot computer 102 for processing. Once the Y-axis scanning of circuit runner 300 is completed, sensor 110 is similarly stepped between points A and C along the X-axis of circuit runner 300. The foregoing process is then repeated at the opposite end of printed circuit board 350 for circuit runner 301.

Figure 4:
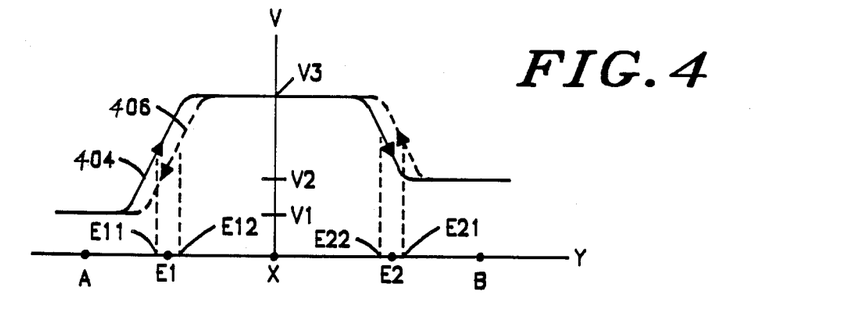
FIG. 4 shows waveforms 404 and 406 of the output of sensor 110 in FIG. 1 as it is moved between points A and B in FIG. 3.

Referring next to FIG. 4, there are illustrated waveforms of the output of sensor 110 in FIG. 1 as it is moved beween points A and B in FIG. 3. Solid-line waveform 404 is for the path 304 from point A to B, and dashed-line waveform 406 is for the path 306 from point B to A. To find the midpoint X of circuit runner 300, rising edges E11 and E21 are calculated and averaged for the rising portions of waveforms 404 and 406, respectively, and falling edges E12 and E22 are calculated and averaged for the falling portions of waveforms 404 and 406, respectively. That is, rising edge E11 is the value of Y for which rising portion of waveform 404 has a value of $\frac{1}{2}(V1+V3)$. Similarly, falling edge E12 is the value of Y for which falling portion of waveform 406 has a value of $\frac{1}{2}(V1+V3)$. Rising edge E21 is the value of Y for which rising portion of waveform 406 has a value of $\frac{1}{2}(V2+V3)$. Similarly, falling edge E22 is the value of Y for which falling portion of waveform 404 has a value of $\frac{1}{2}(V2+V3)$. Then, the rising edge midpoint XR is calculated by taking the average of rising edges E11 and E21. Similarly, the falling edge midpoint XF is calculated by taking the average of falling edges E12 and E22. If XR and XF do not agree within 0.0005 inches, the process is repeated. The calculated values of XR and XF for circuit runners 300 and 301 are then used to offset the selected component placement program. Note that thresholds V1 and V2 may differ due to misalignment of sensor 110. The use of both rising edges and both falling edges to calculate midpoints XR and XF, respectively, compensates for misalignment of sensor 110. In the preferred embodiment of the present invention, the foregoing calculations are performed by robot computer 102 in accordance with the computer program in the Appendix hereinbelow. For other robots, where the ability to run programs is limited, the sensor data collection and location-offset correction activities may be performed by personal computer 152.

Figure 5:
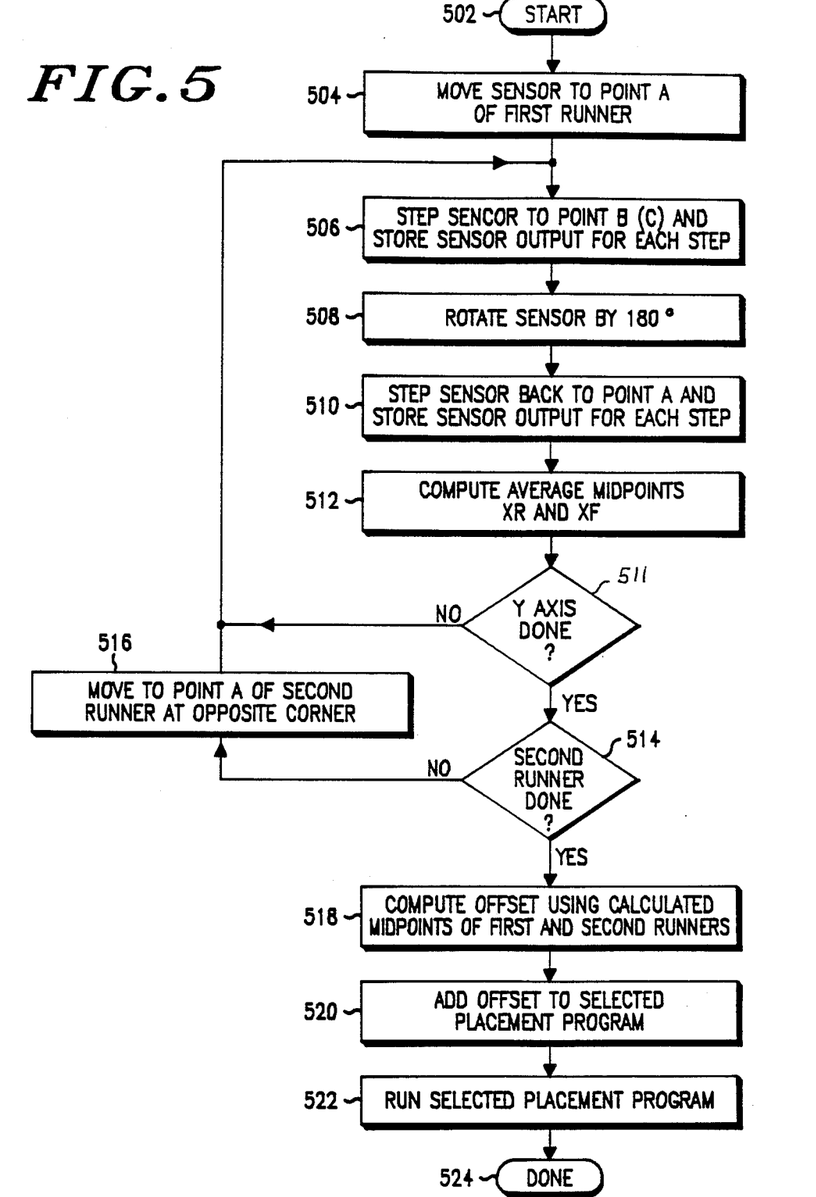
FIG. 5 is a flow chart for the process used by the robot computer 102 in FIG. 1 for running a component placement program on robot 100.

Referring to FIG. 5, there is illustrated a flow chart for the process used by the robot computer 102 in FIG. 1 for running a component placement program on robot 100. Start block 502 is entered upon selection via the keyboard of personal computer 152 of a component placement program. Proceeding to block 504, sensor 110 is moved to point A of the first runner 300. Next, at block 506, sensor 110 is stepped to point B while storing the sensor output for each step. Then, at block 510, sensor 110 is rotated by 180°. Next, at block 508, sensor 110 is stepped back to point A while storing the sensor output for each step. The average rising midpoint XR and falling midpoint XF is then calculated at block 512.

Next, at decision block 511, a check is made to determine if the Y-axis offset has been calculated. If not, NO branch is taken back to repeat blocks 506, 508, 510 and 512 for the path between points A and C. If the Y-axis offset has been calculated, YES branch is taken from decision block 511 to decision block 514, where a check is made to determine if second circuit runner 301 has been done. If not, NO branch is taken to block 516 where sensor 110 is moved to point A of second circuit runner 301. Thereafter, blocks 506, 508, 510 and 512 are repeated for points A, B and A,C for circuit runner 301. If second circuit runner has been done, YES branch is taken from decision block 514 to block 518 where the offset is computed using the calculated midpoints of the first and second circuit runners 300 and 301. Next, at block 520, the computed offset is added to the selected component placement program. Lastly, at block 522, the selected component placement program is executed by robot computer 102. Thereafter, program control returns to other tasks at done block 524.

Figure 6:
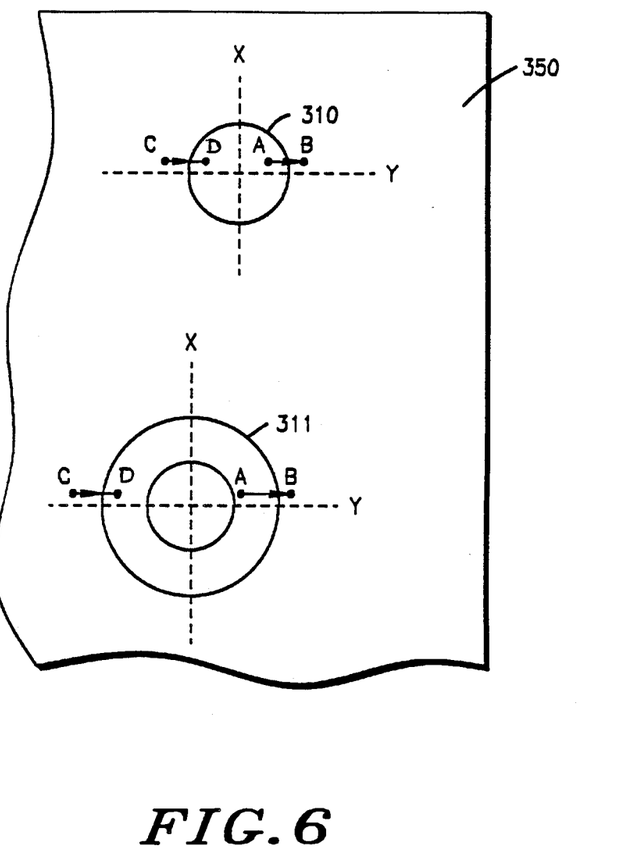
FIG. 6 is another section of printed circuit board 350 including a circular metalized circuit pad 310 and a ring shaped metalized circuit pad 311 on the surface of the printed circuit board.

Referring to FIG. 6, there are illustrated a circular metalized circuit pad 310 and a ring shaped metalized circuit pad 311 that likewise can be sensed by the circuit location process of the present invention. For locating each of pads 310 and 311, sensor 110 is first positioned by robot 100 at point A and stepped along the Y-axis to point B. This allows determination of falling edge midpoint XF (see FIG. 4). Sensor 110 is then positioned by robot 100 at point C and stepped along the Y-axis to point D. This allows determination of rising edge midpoint XR. Similar measurements can be taken along the X-axis to determine rising edge midpoint YR.

The diameters of the circular pads 310–313 are generally greater than the width of the circuit runners 300–301. Positioning sensor 110 at each of two successive locations A and C allows sensor 110 and robot 100 to sense the circular pad 310–311 in fewer steps, and less time, than required to step across the entire circuit runner 300 as explained hereinabove with respect to FIG. 3. Positioning the sensor 110 at each of two locations A, B, and C,D in FIG. 6 avoids the necessity of using additional rising edge and falling edge paths which would occur at the void in the center of pad 311.

Figure 2:
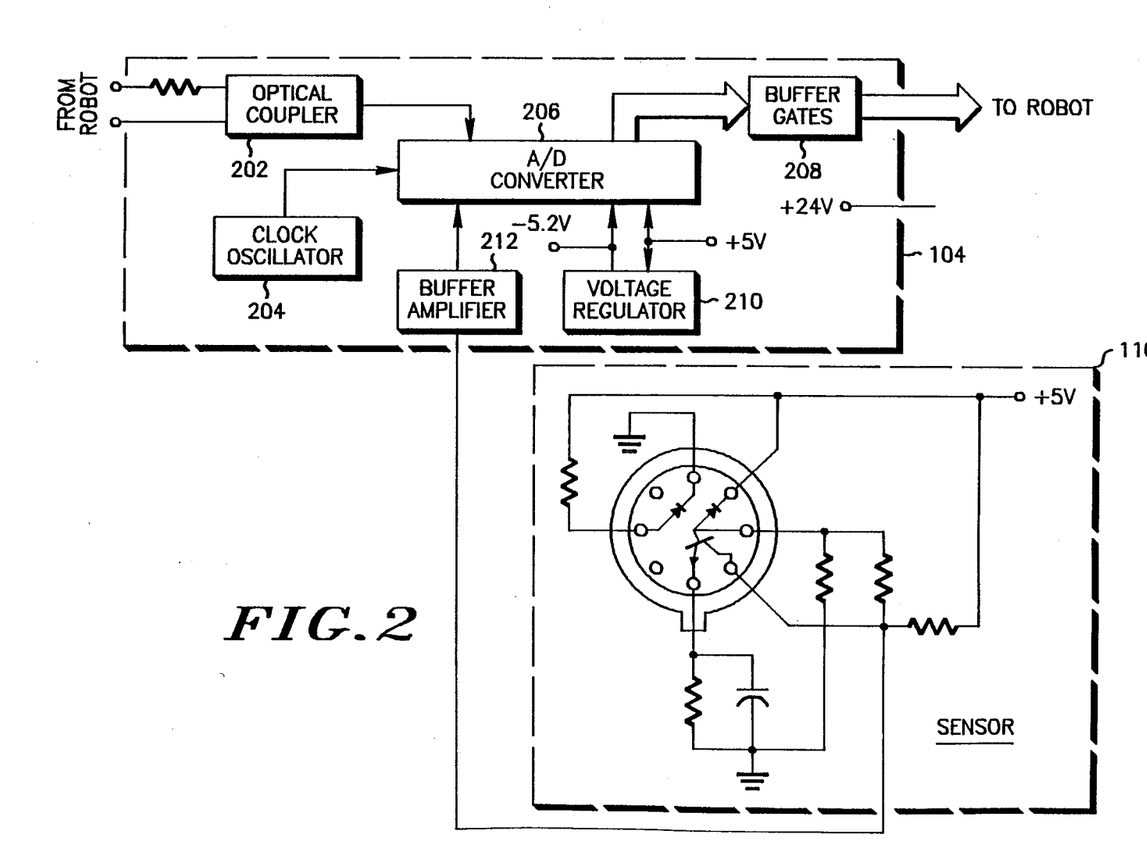
FIG. 2 is a detailed circuit diagram of the A/D converter circuitry 104 and sensor 110 in FIG. 1.

Referring next to FIG. 2, there is illustrated a detailed circuit diagram of the A/D converter circuitry 104 and sensor 110 in FIG. 1. A/D converter circuitry 104 includes optical coupler 202, A/D converter 206, clock oscillator 204, buffer amplifier 212, buffer gates 208 and voltage regulator 210. Optical coupler 202 couples a strobe signal from robot computer 102 to A/D converter 206 for initiating a conversion of a sample of the output of sensor 110. Robot computer 102 produces the strobe signal after each step of the robot arm 116. Buffer amplifier 212 conditions the output of sensor 110 for application to A/D converter 206. Clock oscillator 204 generates a clock signal for A/D converter 206. Voltage regulator 210 generates the −5.2 V voltage for A/D converter circuitry 104 and sensor 110. Buffer gates 208 couple the 8-bit output of A/D converter 206 to robot computer 102. In the preferred embodiment, optical coupler 202 is a Motorola type 6N135 optical coupler, A/D converter 206 is a Motorola type MC6108 A/D converter, clock oscillator 204 is a Motorola type RASC02 oscillator, buffer amplifier 212 is a Motorola type MC3403 amplifier, buffer gates 208 are Motorola type 7407 buffer gates, and voltage regulator 210 is a Motorola type MC34063 voltage regulator.

In summary, a unique circuit location sensor has been described that may be advantageously utilized in component placement robots. The unique sensing apparatus illuminates a circuit board and senses reflected light to determine the location of pre-selected circuit elements on the circuit board and calculate location offsets for the component placement programs subsequently run on the component placement robot. The location sensing apparatus of the present invention may be advantageously utilized in any component placement robot where accurate placement of the components is necessary. Therefore, while a particular embodiment of the present invention has been shown and described, it should be understood that the present invention is not limited thereto since other embodiments may be made by those skilled in the art without departing from the true spirit and scope thereof.

APPENDIX

The following computer program is coded into SPEL programming language, Version 1.0, marketed by Accusembler. SPEL is a programming language similar to Microsoft BASIC programming language, but is compatible only with Accussembler robots. SPEL may be run on IBM personal computers or IBM compatible personal computers used with Accusembler robots. The following computer program provides a detailed description of the computer instructions utilized by robot computer 102 for scanning circuit runners and/or pads and calculating offsets for the placement computer program to be run thereafter.

```
5000  ' REFLECTIVE SENSOR SUBROUTINE
5005  ' **********
5010  ' THE TWO TARGET POINTS ARE DESIGNATED P22 AND P23
5015  ' **********
5020  ARM 3
5025  DIM D(80)
5030  DIM E(80)
5035  DIM G(80)
5037  DIM H(80)
5038  ON 13
5039  ON 14
5040  JUMP P22
5045  ON 15
5050  WAIT 0.2
5060  ' **********
5070  ' SCAN IN X DIRECTION AT P22
5080  M= −1.23
5090  GO P22+XM
5100  N=M+.03
5110  FOR J+0 TO 79
5120  GO P22+XN
5130  ON 7
5140  WAIT 0.1
5150  OFF 7
5160  WAIT 0.1
5170  E(J)=IN(1)
5180  N=N+.03
5190  NEXT
5200  ' **********
5210  ' CALCULATE X OFFSET FOR P22
5220  V1=E(0)
5230  FOR K=1 TO 79 ' FIND MAXIMUM NUMBER
5240  IF E(K)<=V1 THEN GOTO 5260
5250  V1=E(K) ' V1 EQUALS MAXIMUM NUMBER
5260  NEXT
5270  V2=E(0)
5280  FOR L=1 TO 79 ' FIND MINIMUM NUMBER
5290  IF E(L)>=V2 THEN GOTO 5310
5300  V2=E(L) ' V2 EQUALS MINIMUM NUMBER
5310  NEXT
5320  V3−(V1+V2)/2 ' V3 EQUALS MEAN NUMBER
5330  V4=0 ' COMPARE MEAN NUMBER TO ARRAY
5340  IF E(V4)>=V3 THEN GOTO 5370
5350  V4=V4+1
5360  GOTO 5340
5370  V5=79
5380  IF E(V5)>=V3 THEN GOTO 5410
5390  V5=V5−1
5400  GOTO 5380
5410  V6=(V4+V5)/2 ' V6 EQUALS THE STEP LOCATION OF TARGET CENTER
5420  B1=(V6−40)*(.03) ' S1 IS THE X OFFSET FOR P22
5430  IF ABS(S1)<.06 THEN S1=0
5440  ' **********
5450  GO P22+XS1
```

```
5460  WAIT 0.2
5470  ' ********
5480  ' SCAN IN Y DIRECTION AT P22
5490  M=-1.23
5500  GO P22+XS1-YM
5510  N=M+.03
5520  FOR J=0 TO 79
5530  GO P22+XS1-YN
5540  ON 7
5550  WAIT 0.1
5560  OFF 7
5570  WAIT 0.1
5580  G(J)=IN(1)
5590  N=N+.03
5600  NEXT
5610  ' *****
5620  ' CALCULATE Y OFFSET FOR P22
5630  V7-G(0)
5640  FOR K=1 TO 79 ' FIND MAXIMUM NUMBER
5650  IF G(K)<=V7 THEN GOTO 5670
5660  V7=G(K) ' V7 EQUALS MAXIMUM NUMBER
5670  NEXT
5680  V8-G(0)
5690  FIR K=1 TO 79 ' FIND MINIMUM NUMBER
5700  IF G(L)>=VB THE GOTO 5720
5710  V8=G(L) ' V8 EQUALS MINIMUM NUMBER
5720  NEXT
5730  V9=(V7+V8)/2 ' V9 EQUALS MEAN NUMBER
5740  V10=0 ' COMPARE MEAN NUMBER TO ARRAY
5750  IF G(V10)>=V9 THEN GOTO 5780
5760  V10-V10+1
5770  GOTO 5750
5780  V11=79
5790  IF G(V11)>=V9 THEN GOTO 5820
5800  V11=V11-1
5810  GOTO 5790
5820  V12=(V1O+V11/2 ' V12 EQUALS THE STEP LOCATION OF
      TARGET CENTER
5830  S2=(V12-40)*(.03) ' S2 IS THE Y OFFSET FOR P22
5840  IF ABS(S2)<.06 THEN S2=0
5850  ' *******
5860  ' JUMP P23
5870  WAIT 0.2
5880  ' *******
5890  ' SCAN IN X DIRECTION AT P23
5900  M1 =1.23+S1
5910  GO P23+XM1+YS2
5920  N1=M1+.03
5930  FOR J-0 TO 79
5940  GO P23+XN1+YS2
5950  ON 7
5960  WAIT 0.1
5970  OFF 7
5980  WAIT 0.1
5990  H(J)=IN(1)
6000  N1-N1+.03
6010  NEXT
6020  ' ******
6030  ' CALCULATE X OFFSET FOR P23
6040  V13=H(0)
6050  FOR K-1 TO 79 ' FIND MAXIMUM NUMBER
6060  IF H(K)<=V13 THEN GOTO 6080
6070  V13=H(K) ' V13 EQUALS MAXIMUM NUMBER
6080  NEXT
6090  V14=H(0)
6100  FOR L=1 TO 79 ' FIND MINIMUM NUMBER
6110  IF H(L)>=V14 THEN GOTO 6130
6120  V14=E(L) ' V14 EQUALS MINIMUM NUMBER
6130  NEXT
6140  V15=(V13+V14)/2 ' V15 EQUALS MEAN NUMBER
6150  V16=0 ' COMPARE MEAN NUMBER TO ARRAY
6160  IF H(V16)>=V15 THEN GOTO 6190
6170  V16=V16+1
6180  GOTO 6160
6190  V17-79
6200  IF E(V17)>=V15 THEN GOTO 6230
6210  V17=V17-1
6220  GOTO 6200
6230  V18=(V16+V17)/2 ' V18 EQUALS THE STEP LOCATION OF
      TARGET CENTER
6240  S3=(V18-40)*(.03) ' S3 IS THE X OFFSET FOR P23
6250  IF ABS(S3)<.06 THEN S3=0
```

-continued

```
6260 ' ********
6270 GO P23
6280 WAIT 0.2
6290 ' ********
6300 ' SCAN IN Y DIRECTION AT P23
6310 M2=-1.23+S2
6315 S8-S1+S3
6320 GO P23+XS8-YM2
6330 N2=M2+.03
6340 FOR J=0 TO 79
6350 GO P23+XS8-YN2
6360 ON 7
6370 WAIT 0.1
6380 OFF 7
6390 WAIT 0.1
6400 D(J)=1N(1)
6410 N2=N2+.03
6420 NEXT
6430 ' *******
6440 ' CALCULATE Y OFFSET FOR P23
6450 V19=D(0)
6460 FOR K=1 TO 79 ' FIND MAXIMUM NUMBER
6470 IF D(K)<=V19 THEN GOTO 6490
6480 V19=D(K) ' V19 EQUALS MAXIMUM NUMBER
6490 NEXT
6500 V20=D(0)
6510 FOR L=1 TO 79 ' FIND MINIMUM NUMBER
6520 IF D(L)>=V20 THEN GOTO 6540
6530 V20-D(L) ' V20 EQUALS MINIMUM NUMBER
6540 NEXT
6550 V21=(V19+V20)/2 ' V21 EQUALS MEAN NUMBER
6560 V22=0 ' COMPARE MEAN NUMBER TO ARRAY
6570 IF D(V22)>=V21 THEN GOTO 6600
6580 V22=V22+1
6590 GOTO 6570
6600 V23=79
6610 IF D(V23)>=V21 THEN GOTO 6650
6620 V23=V23-1
6630 GOTO 6610
6650 V24=(V22+V23)/2 'V24 EQUALS THE STEP LOCATION OF TARGET CENTER
6660 S4=(V24-40)*(.03) ' S4 IS THE Y OFFSET FOR P23
6670 IF ABS(SR)<.06 THEN S4=0
6680 ' ********
6700 OFF 15
6710 OFF 14
6720 OFF 13
6770 RETRN
6780 ' ********
7000 ' CIRCUIT BOARD OFFSET SUBROUTINE
7010 ' ********
7040 Q( )=
7050 T( )=
7060 C1=ABS(S3/(Q(23)-Q(22))) ' ACCUSEMBLER X STRETCH
7070 C2=ABS(S4/(T(23)-T(22))) ' ACCUSEMBLER Y STRETCH
7080 IF C1=C2 THEN GOTO 7190 ' NO ANGLE OFFSET
7090 IF C1<C2 THEN GOTO 7135 ' ANGLE OFFSET CALCULATION
7100 B1=(C1-C2)*(Q(23)-Q(22))
7110 B2=ABS(T(23)-T(22))/SQR((B1*B1)+(T(23)-T(22))°(T(23)-T(22)))
7120 B=ACS(B2)
7130 IF S3>0 THEN B=B*(-1)
7134 GOTO 7170
7135 B3=(CE-C1)*(T(23)-T(22))
7140 B4=ABS(Q(23)-Q(22))/SQR((B3*B3)+(Q(23)-Q(22))°(Q(23)-Q(22)))
7150 B=ACS(B4) ' ANGLE VALUE
7160 IF S4>0 THEN B=B*(-1)
7170 ' ********
7180 S7=B*180/3.141593 ' U OFFSET FOR ACCUSEMBLER
7185 GOTO 7200
7190 S7-0
7200 ' ********
7210 B5=SQR((Q(C)-Q(22))*(Q(C)-Q(22))+(T(C)-T(22))*(T(C)-T(22)))
7220 B6=(T(C)-T(22))/B5
7230 B7-ACS(B6) ' PLACEMENT POINT ANGLE
7240 B8=B7+B
7250 C3=SIN(B8)*B5+(Q(C)-Q(22))
7260 ' ********
```

```
-continued
7270 S5=S1+C3+(S3*(Q(C)-Q(22))/(Q(23)-Q(22))) ' X OFFSET
7280 '********
7290 C4=COS(B8)*B5-T(C)-(22))
7300 '********
7310 S6=S2+C4+(S4*(T(C)-T(22))/(T(23)-T(22))) ' Y OFFSET
7320 '********
7330 RETRN
7340 '********
```

The present invention encompasses any and all such embodiments covered by the following claims:

I claim:

1. Component placement apparatus including processing means and a robot arm for placing components on a circuit board having at least one circuit element thereon with first and second edge portions, the processing means producing a control signal for positioning the robot arm and producing a strobe signal when the robot arm is positioned, said component placement apparatus further comprising:

sensing means attached to the robot arm and including a light source producing light for illuminating the circuit board and an optical reflective light sensor for producing an output signal having a magnitude proportional to the light reflected from the illuminated circuit board; and converting means coupled to said sensing means for converting said output signal to a digitized signal in response to the strobe signal; and said processing means coupled to the robot arm for producing the control signal to step said sensing means across said at least one circuit element and coupled to the converting means for processing the digitized signal produced at each step for detecting the location of said at least one circuit element on the circuit board.

2. The component placement apparatus according to claim 1, wherein said converting means includes an analog to digital converter.

3. A method for use in a component placement apparatus for determining the location of at least one circuit element with first and second edge portions on a circuit board, the component placement apparatus including processing means as a robot arm for placing components on the circuit board, said method comprising the steps of:

illuminating the circuit board with light produced by a light source in sensing means attached to the robot arm;

sensing the light reflected from the circuit board with an optical reflective light sensor in the sensing means, the optical reflective light sensor producing an output signal having a magnitude proportional to the light reflected form the illuminated circuit board;

stepping the optical reflective light sensor across said at least one circuit element;

processing the output signal of the optical reflective light sensor for each step for detecting the location of said at least one circuit element.

4. The method according to claim 3, wherein the output signal of the optical reflective light sensor has rising and falling portions when sensing light reflected from the first and second edge portions, respectively, and said processing step further includes the steps of:

detecting the rising and falling portions of the output signal of the optical reflective light sensor to determine the location of the first and second edge portions of said at least one circuit element; and computing the location of said at least one circuit element using the determined location of the first and second edge portions of said at least one circuit element.

5. The method according to claim 3, wherein said processing step further includes the steps of:

converting the output signal of the optical reflective light sensor to a digitized signal for each step;

storing the digitized signal from each step; and computing the location of said at least one circuit element using the stored digitized signals.

6. The method according to claim 3, wherein said stepping step includes for a first path across said at least one circuit element the steps of:

stepping the optical reflective light sensor across the first edge of said at least eon circuit element; and stepping the optical reflective light sensor across the second edge of said at least one circuit element.

7. The method according to claim 6, further including the step of repeating said stepping steps for a second path across said at least one circuit element substantially perpendicular to said first path.

8. A method of operating component placement apparatus including processing means and a robot arm for placing components on a circuit board having at least one circuit element thereon with first and second edge portions, said method comprising the steps of:

(a) loading a component placement program into said processing means;

(b) determining the location of said at least one circuit element by the steps of:

(i) illuminating the circuit board with light produced by a light source in sensing means attached to the robot arm;

(ii) sensing the light reflected from the circuit board with an optical reflective light sensor in the sensing means, the optical reflective light sensor producing an output signal having a magnitude proportional to the light reflected from the illuminated circuit board;

(iii) stepping the optical reflective light sensor across said at least one circuit element;

(iv) processing the output signal of the optical reflective light sensor for each step for detecting the location of said at least one circuit element;

(c) modifying the component placement program using the location determined for said at least one circuit element; and (d) executing the modified component placement program.

9. Component placement apparatus including processing means and a robot arm for placing components on a circuit board having at least one circuit element thereon with first and second edge portions, the processing means producing a control signal for positioning the robot arm and producing a strobe signal when the robot arm is positioned, said component placement apparatus further comprising:
- sensing means attached to the robot arm and including a light source producing light for illuminating the circuit board and an optical reflective light sensor for producing an output signal having a magnitude proportional to the light reflected from the illuminated circuit board; and
- converting means coupled to said sensing means for converting said output signal to a digitized signal in response to the strobe signal; and
- said processing means coupled to the robot arm for producing the control signal to step said sensing means across said at least one circuit element at least two times along the same path and coupled to the converting means for processing the digitized signal produced at each step for detecting the location of said at least one circuit element on the circuit board.

10. Component placement apparatus including processing means and a robot arm for placing components on a circuit board having at least one circuit element thereon with first and second edge portions, the processing means producing a control signal for positioning the robot arm and producing a strobe signal when the robot arm is positioned, said component placement apparatus further comprising:
- sensing means attached to the robot arm and including a light source producing light for illuminating the circuit board and an optical reflective light sensor for producing an output signal having a magnitude proportional to the light reflected from the illuminated circuit board; and
- converting means coupled to said sensing means for converting said output signal to a digitized signal in response to the strobe signal; and
- said processing means coupled to the robot arm for producing the control signal to step said sensing means across said at least one circuit element and coupled to the converting means for processing the digitized signal produced at each step for detecting the location of the first and second edge portions of said at least one circuit element on the circuit board.

* * * * *